(12) United States Patent
Adamec (10) Patent No.: US 9,847,208 B1
(45) Date of Patent: Dec. 19, 2017

(54) ELECTRON BEAM DEVICE, COLD FIELD EMITTER, AND METHOD FOR REGENERATION OF A COLD FIELD EMITTER

(71) Applicant: ICT Integrated Circuit Testing Gesellschaft für Halbleiterprüftechnik mbH, Heimstetten (DE)

(72) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/233,092

(22) Filed: Aug. 10, 2016

(51) Int. Cl.
| | |
|---|---|
| H01J 1/144 | (2006.01) |
| H01J 1/15 | (2006.01) |
| H01J 37/073 | (2006.01) |
| H01J 37/147 | (2006.01) |
| H01J 37/244 | (2006.01) |
| H01J 37/28 | (2006.01) |

(52) U.S. Cl.
CPC .......... *H01J 37/073* (2013.01); *H01J 37/147* (2013.01); *H01J 37/244* (2013.01); *H01J 37/28* (2013.01); *H01J 2203/0204* (2013.01)

(58) Field of Classification Search
CPC ........ H01J 37/065; H01J 37/073; H01J 37/07; H01J 37/242; H01J 1/144; H01J 1/15; H01J 1/3044; H01J 27/022; H01J 9/025
USPC ......... 250/305, 306, 310, 311, 423 F, 423 R; 313/310, 326, 336, 351, 309, 311, 359.1, 313/362.1
See application file for complete search history.

(56) References Cited

U.S. PATENT DOCUMENTS

| | | | | |
|---|---|---|---|---|
| 5,627,373 A | * | 5/1997 | Keese | H01J 37/265 250/310 |
| 6,819,811 B1 | * | 11/2004 | Goldstein | B82Y 30/00 385/12 |
| 7,888,654 B2 | * | 2/2011 | Tessner, II | H01J 1/3044 250/305 |

(Continued)

*Primary Examiner* — David A Vanore
(74) *Attorney, Agent, or Firm* — Kilpatrick Townsend & Stockton LLP (57) ABSTRACT

The present disclosure provides an electron beam device (500) for inspecting a sample (10) with an electron beam, comprising an electron beam source comprising a cold field emitter (100) for emitting an electron beam, electron beam optics for directing and focusing the electron beam onto the sample (10), and a detector device (540) for detecting secondary charged particles generated by impingement of the electron beam on the sample (10). The cold field emitter (100) includes an emitter tip (110), a base arrangement (120) configured for supporting the emitter tip (110) and comprising a first base element (122) and a second base element (124), and a filament (130) having at least a first filament portion (132) and a second filament portion (134) attaching the emitter tip (110) to the base arrangement (120), wherein the first filament portion (132) extends between the emitter tip (110) and the first base element (122) and the second filament portion (134) extends between the emitter tip (110) and the second base element (124), wherein a length (L) of each of the first filament portion (132) and the second filament portion (134) is 4 mm or less, and wherein a diameter of a cross-section of each of the first filament portion (132) and the second filament portion (134) is 0.13 mm or less.

15 Claims, 3 Drawing Sheets

(56) References Cited

U.S. PATENT DOCUMENTS

| | | | | |
|---|---|---|---|---|
| 7,969,080 B2 * | 6/2011 | Terui | ........................ | B82Y 10/00 |
| | | | | 313/310 |
| 8,040,034 B2 * | 10/2011 | Nonogaki | .................. | H01J 1/15 |
| | | | | 313/336 |
| 8,080,930 B2 * | 12/2011 | King | .......................... | F03H 1/00 |
| | | | | 250/423 R |
| 9,640,360 B2 * | 5/2017 | Shichi | ...................... | H01J 37/08 |
| 2006/0226753 A1 * | 10/2006 | Adamec | .................. | H01J 1/135 |
| | | | | 313/310 |

* cited by examiner

ELECTRON BEAM DEVICE, COLD FIELD EMITTER, AND METHOD FOR REGENERATION OF A COLD FIELD EMITTER

FIELD

Embodiments of the present disclosure relate to an electron beam device, a cold field emitter for an electron beam device, and a method for regeneration of a cold field emitter. Embodiments of the present disclosure particularly relate to a cold field emitter for an electron microscope, such as a scanning electron microscope (SEM).

BACKGROUND

Electron beam devices have many functions in a plurality of industrial fields, including, but not limited to, electron beam inspection (EBI), critical dimension (CD) measurements of semiconductor devices during manufacturing, defect review (DR) of semiconductor devices during manufacturing, exposure systems for lithography, detecting devices and testing systems. Inspecting samples within the nanometer scale can be done with electron beams generated by, for example, a cold field emitter.

A cold field emitter uses an electric field to provide the conditions for electrons to tunnel through an energy barrier to produce the electron beam. The electron beam can be focused on a comparably small spot with sufficient current to provide rapid, consistent data collection. A cold field emitter provides high brightness with a small energy spread and offers improved resolution for electron beam devices.

Because of the small spot size, mechanical instabilities of the cold field emitter can reduce a resolution of the electron beam device. Further, the cold field emitter can be heated periodically to repair damage and to remove molecules from an emitter tip. Heating the cold field emitter interrupts the operation of the electron beam device, thus reducing a throughput.

In view of the above, an electron beam device, a cold field emitter for an electron beam device, and a method for regeneration of a cold field emitter that overcome at least some of the problems in the art are beneficial. In particular, cold field emitters, electron beam devices, and methods that can provide at least one of an improved mechanical stability and thermal stability of a cold field emitter are beneficial.

SUMMARY

In light of the above, an electron beam device, a cold field emitter, and a method for regeneration of a cold field emitter are provided. Further aspects, benefits, and features of the present disclosure are apparent from the claims, the description, and the accompanying drawings.

According to an aspect of the present disclosure, an electron beam device for inspecting a sample with an electron beam is provided. The electron beam device includes an electron beam source comprising a cold field emitter for emitting an electron beam, electron beam optics for directing and focusing the electron beam onto the sample, and a detector device for detecting secondary charged particles generated by impingement of the electron beam on the sample. The cold field emitter includes an emitter tip, a base arrangement configured for supporting the emitter tip and including, or consisting of, a first base element and a second base element, and a filament having at least a first filament portion and a second filament portion attaching the emitter tip to the base arrangement. The first filament portion extends between the emitter tip and the first base element and the second filament portion extends between the emitter tip and the second base element. A length of each of the first filament portion and the second filament portion is 4 mm or less. A diameter of a cross-section of each of the first filament portion and the second filament portion is 0.13 mm or less.

According to a further aspect of the present disclosure, a cold field emitter for an electron beam device is provided. The cold field emitter includes an emitter tip, a base arrangement configured for supporting the emitter tip and includes, or consists of, a first base element and a second base element, and a filament having at least a first filament portion and a second filament portion attaching the emitter tip to the base arrangement, wherein the first filament portion extends between the emitter tip and the first base element and the second filament portion extends between the emitter tip and the second base element, wherein a length of each of the first filament portion and the second filament portion is 4 mm or less, and wherein a diameter of a cross-section of each of the first filament portion and the second filament portion is 0.13 mm or less.

According to another aspect of the present disclosure, a cold field emitter for an electron beam device is provided. The cold field emitter includes an emitter tip, a base arrangement configured for supporting the emitter tip and including a first base element and a second base element, and a filament having at least a first filament portion and a second filament portion attaching the emitter tip to the base arrangement. The first filament portion has a first bend and the second filament portion has a second bend.

According to a further aspect of the present disclosure, a cold field emitter for an electron beam device is provided. The cold field emitter includes an emitter tip, a base arrangement configured for supporting the emitter tip and including, or consisting of, a first base element and a second base element, and a filament having at least a first filament portion and a second filament portion attaching the emitter tip to the base arrangement. The first filament portion extends between the emitter tip and the first base element and the second filament portion extends between the emitter tip and the second base element. The first base element and/or the second base element has a thermal conductance of 0.05 W/K or higher, or 0.3 W/K or higher.

According to yet another aspect of the present disclosure, a method for regeneration of a cold field emitter is provided. The method includes heating an emitter tip via a first filament portion connecting the emitter tip to a first base element and a second filament portion connecting the emitter tip to a second base element, wherein a length of each of the first filament portion and the second filament portion is 4 mm or less, and wherein a diameter of a cross-section of each of the first filament portion and the second filament portion is 0.13 mm or less.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The method includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Cold field emitters can be used in electron beam devices, such as electron microscopes. In view of the small spot size in the range of a few nanometers, the cold field emitter should be mechanically stable in order to improve a resolution of the electron beam device. Further, a structure of the cold field emitter can be similar to a thermal emitter or a Schottky emitter. Unlike a thermal emitter or Schottky emitter, the cold field emitter is not heated during operation. The cold field emitter can be heated for refreshment or regeneration using pulse heating. During such a regeneration process, the electron beam device is not in operation. In order to reduce a downtime of the electron beam device, it is beneficial that, after a heat pulse, the cold field emitter stabilizes quickly both thermally and mechanically. In particular, the cold field emitter should reach a normal operation temperature (e.g., room temperature) within a short time.

The present disclosure provides a cold field emitter having a filament with a first filament portion and a second filament portion having improved mechanical and thermal characteristics. In some embodiments, a length of each of a first filament portion and a second filament portion of the filament is 4 mm or less, and a diameter of a cross-section of each of the first filament portion and the second filament portion is 0.13 mm or less. The combination of the length and the diameter can provide an improved mechanical stability and an improved thermal performance, for example, during and/or after a heating procedure. As an example, a thermal and/or mechanical stabilization time after a heating procedure can be reduced to several seconds. A downtime of the electron beam device can be reduced and a throughput can be increased. Further, the mechanically stable configuration can improve a resolution of the electron beam device.

Figure 1:
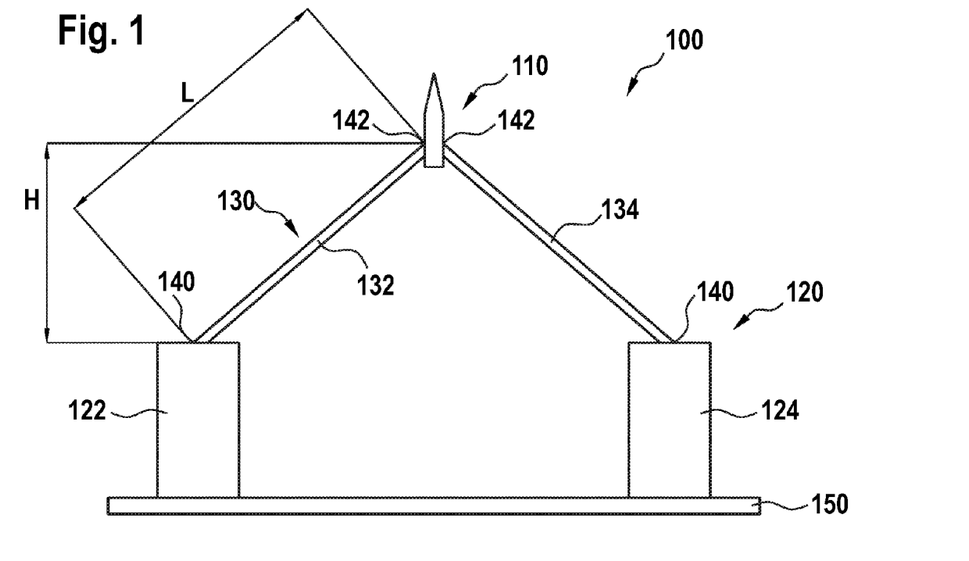
FIG. 1 shows a schematic view of a cold field emitter for an electron beam device according to embodiments described herein.

FIG. 1 shows a schematic view of a cold field emitter 100 for an electron beam device according to embodiments described herein. The cold field emitter 100 can also be referred to as "cold field electron emitter".

The cold field emitter 100 includes an emitter tip 110, a base arrangement 120 configured for supporting the emitter tip 110 and including, or consisting of, a first base element 122 and a second base element 124, and a filament 130 having at least a first filament portion 132 and a second filament portion 134 attaching the emitter tip 110 to the base arrangement 120. The word "consisting" is to be understood in the sense that the base arrangement 120 has exactly two base elements, namely the first base element 122 and the second base element 124. The words "comprising" and "including" are to be understood in the sense that the base arrangement 120 has two base elements, namely the first base element 122 and the second base element 124, and optionally one or more further base elements.

According to some embodiments, which can be combined with other embodiments described herein, the base arrangement 120 can be provided on a substrate 150. The emitter tip 110 can include, or be, an emitter crystal. As an example, the emitter tip 110 includes a material selected from the group consisting of a refractory metal, tungsten, tantalum, rhenium, molybdenum, iridium, alloys thereof, and any combination thereof.

The first filament portion 132 extends between the emitter tip 110 and the first base element 122, attaching the emitter tip 110 to the first base element 122. The second filament portion extends between the emitter tip 110 and the second base element 124, attaching the emitter tip 110 to the second base element 124. In some implementations, the emitter tip 110 is only supported by the first base element 122 and the second base element 124 using the filament 130, and is not supported by any other element, such as a support element or further base element on which the emitter tip 110 could rest.

In some embodiments, the first filament portion 132 and the second filament portion 134 can have a substantially linear or straight shape. The first filament portion 132 and the second filament portion 134 can be integrally formed, i.e., made of one single piece of material, such as a wire. As an example, the wire can have a (first) bend or kink to provide the first filament portion 132 and the second filament portion 134. The emitter tip 110 can be bonded, e.g. welded, to the filament 130 in a region of the bend or kink. In alternative examples, the first filament portion 132 and the second filament portion 134 can be provided as separate portions. End portions of the first filament portion 132 and the second filament portion 134 can be bonded, e.g. welded, to the emitter tip 110 and/or the base arrangement 120.

A length L of each of the first filament portion 132 and the second filament portion 134 can be 4 mm or less, specifically 3 mm or less, and more specifically 2 mm or less. A total length of the filament 130 can be defined as the sum of the length of the first filament portion 132 and the length of the second filament portion 134. For example, when the length of each of the first filament portion 132 and the second filament portion 134 is 4 mm, the total length of the filament 130 can be 8 mm. The first filament portion 132 and the second filament portion 134 can have substantially the same length. The term "substantially" shall account for manufacturing tolerances of up to plus/minus 5% of the nominal length (e.g. 4 mm) of a filament portion, wherein the lengths are still considered to be substantially the same.

In some implementations, the length L of a respective filament portion can be defined between a contact point or attachment point of the filament portion and the base arrangement 120 and a contact point or attachment point of the filament portion and the emitter tip 110. As an example, the length L can be measured from contact to contact. As an example, the length of the filament portion can be measured between the point/contact at which the emitter tip 110 is bonded, e.g., welded, to the filament portion and the point/contact at which the filament portion is bonded, e.g., welded, to the base arrangement 120. For example, the length of the first filament portion 132 can be measured or defined between a first attachment point 140 at which the first filament portion 132 is attached or bonded to the first base element 122 and a second attachment point 142 at which the first filament portion 132 is attached bonded to the emitter tip 110. The length of the second filament portion 134 can be measured or defined between a first attachment point 140 at which the second filament portion 134 is attached or bonded to the second base element 124 and a second attachment point 142 at which the second filament portion 134 is attached bonded to the emitter tip 110. The first attachment point 140 and the second attachment point 142 can be configured as electrical contacts, for example, for providing a heating current to the emitter tip 110.

The first filament portion 132 and the second filament portion 134 can be substantially symmetrical and/or substantially symmetrically arranged. As an example, the first filament portion 132 and the second filament portion 134 can form a (e.g. roughly symmetric) V-shape, for example, in a side view of the cold field emitter 100.

According to some embodiments, which can be combined with other embodiments described herein, a height H of the first filament portion 132 and the second filament portion 134 can be measured in a direction e.g. perpendicular to a surface of the substrate 150 from a point where the perspective filament portion is bonded to the base arrangement 120 to a height corresponding to a point where the emitter tip 110 is bonded to the filament portion. The direction in which the height H is measured can be a substantially vertical direction. The height H of each of the first filament portion 132 and the second filament portion 134 can be 3 mm or less, specifically 2 mm or less, and more specifically 1 mm or less. For a given length L, the height H can be adjusted by selecting a distance or spacing between the first base element 122 and the second base element 124.

The diameter of a cross-section of each of the first filament portion 132 and the second filament portion 134 can be 0.13 mm or less, specifically 0.1 mm or less, and more specifically 0.09 mm or less. The cross-section can be defined in a plane substantially perpendicular to the length direction of the respective filament portion. The diameter can be defined as a dimension or an extension of the cross-section through a center point of the cross-sectional area. For example, the diameter can be defined as a minimum, maximum or average extension of the cross-section through the center point of the cross-sectional area.

According to some embodiments, a cross-sectional area of each of the first filament portion 132 and the second filament portion 134 can be 0.017 mm$^2$ or less, specifically 0.01 mm$^2$ or less, and more specifically 0.005 mm$^2$ or less.

According to some embodiments, which can be combined with embodiments described herein, a circumference of the cross-section of each of the first filament portion 132 and the second filament portion 134 is continuous. In other words, the circumference of the cross-section may not exhibit any steps or other discontinuous features. As an example, the first filament portion 132 and the second filament portion 134, and particularly the circumference of the cross-section, can be round or oval. In further embodiments, the first filament portion 132 and the second filament portion 134, and particularly the circumference of the cross-section, can be rectangular. In such a case, the circumference is discontinuous. The rectangle can have a side ratio of 1.5 or less, and can specifically have a side ratio in a range of 1.1 to 1.5.

The diameter range used for the filament 130 can provide for a fast thermal stabilization of the cold field emitter 100, for example, after a regeneration process involving heating of the emitter tip 110. Unlike the cold field emitter 100, thermal emitters and Schottky emitters are constantly heated to temperature in the range of, for example, 1600 K-2700 K, e.g., by resistive heat generated in the heating filament. The temperature is held constant and transient thermal behavior does not play any role in the emitter operation.

In some implementations, a (combined) resonance frequency of the emitter tip 110 and the filament 130 can be 5 kHz or higher, specifically 7 kHz or higher, and more specifically 9 kHz or higher. The dimensioning of the filament 130 provides for the high resonance frequency of vibration, leading to an improved mechanical stability, and particularly a high stiffness. Yet, the dimensioning of the filament 130, and particularly the diameter of the filament portions, can provide thermal characteristics that allow for a fast thermal stabilization of the cold field emitter, for example, after a heating process.

The cold field emitter 100 can have a small virtual source size, for example, less than 10 nm, and particularly in the range of 2-5 nm. The source size is significantly smaller than for other sources. As an example, a Schottky source can have a virtual source in the range of 20-30 nm. Mechanical vibrations of the source would smear and spread the size of the virtual source and limit a performance. In particular, a resonance frequency of 2 kHz or even 3 kHz could lead to a significant reduction in performance (e.g., resolution) due to a smearing and spreading of the virtual source size. The dimensioning of the filament 130 of the present disclosure can improve a mechanical stability and increase the resonance frequency.

Figure 2:
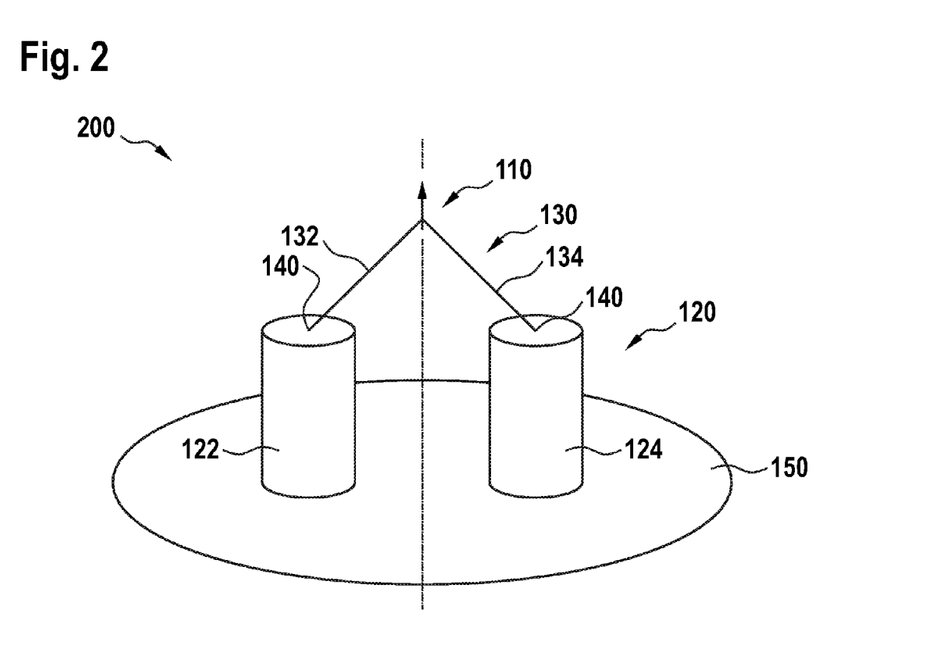
FIG. 2 shows a schematic view of a cold field emitter for an electron beam device according to further embodiments described herein.

FIG. 2 shows a schematic view of a cold field emitter 200 for an electron beam device according to further embodiments described herein. The cold field emitter 200 can be combined with any other aspect and embodiment described herein.

According to an aspect of the present disclosure, which can be combined with other aspects described herein, a cold field emitter 200 for an electron beam device is provided. The cold field emitter 200 includes an emitter tip 110, a base arrangement 120 configured for supporting the emitter tip and including, or consisting of, a first base element 122 and a second base element 124, and a filament 130 having at least a first filament portion 132 and a second filament portion 134 attaching the emitter tip 110 to the base arrangement 120. The first filament portion 132 extends between the emitter tip 110 and the first base element 122 and the second filament portion 134 extends between the emitter tip 110 and the second base element 124. The first base element 122 and/or the second base element 124 has a thermal conductance of 0.05 W/K or higher, or 0.3 W/K or higher.

According to some embodiments, which can be combined with other embodiments described herein, the first base element 122 and the second base element 124 are made from a material selected from the group consisting of tungsten, molybdenum, tantalum, rhodium, iridium, and any combination thereof. The first base element 122 and the second base element 124 can be thermal stabilization elements. In particular, the first base element 122 and the second base element 124 can transport heat from the (heated) filament to the substrate 150.

The substrate 150 can be a fixture connecting the thermal stabilization element to the environment. As an example, after providing a heating pulse to the filament 130 and the emitter tip 110, the first base element 122 and the second base element 124 can transport the accumulated heat away from the filament 130 through the substrate 150 to the environment. In some implementations, the first base element 122 and/or the second base element 124 can have a thermal conductance of 0.05 W/K or higher, specifically 0.1 W/K or higher, and more specifically 0.3 W/K or higher. A heat conductance between the point where the filament 130 is bonded to the base arrangement 120 and the area where the base arrangement 120 is bonded to the substrate 150 is high, further improving thermal stabilization of the cold field emitter 200. According to some embodiments, the base arrangement 120 has a total thermal conductance of 0.1 W/K or higher, specifically 0.2 W/K or higher, and more specifically 0.5 W/K or higher. The total thermal conductance can correspond to a combined thermal conductance at least of the base elements, such as the first base element 122 and the second base element 124.

According to some embodiments, which can be combined with other embodiments described herein, the first base element 122 and the second base element 124 can have a cylindrical shape. Specifically, the first base element 122 and the second base element 124 can have the form of a cylinder. In some implementations, the first base element 122 and the second base element 124 can have a cylinder diameter of 2 mm or larger, specifically 2.5 mm or larger, more specifically 3 mm or larger.

The term "cylinder" can be understood as having a circular bottom surface and a circular upper surface and a curved surface area or shell connecting the bottom surface and the upper surface. The filament 130 can be bonded to the circular upper surface. The substrate 150 can be bonded to the circular bottom surface. As an example, the first filament portion 132 can be bonded to the circular upper surface of the first base element 122 and the second filament portion 134 can be bonded to the circular upper surface of the second base element 124.

The cold field emitter 200 can include one or more of the following aspects, and can particularly include any combination of the following aspects.

According to an embodiment, the first base element 122 and/or the second base element 124 is a thermal stabilization element.

According to an embodiment, the cold field emitter 200 includes the substrate configured to support the base arrangement 120.

According to an embodiment, the first base element 122 and/or the second base element 124 has a thermal conductance of 0.05 W/K or higher, specifically 0.1 W/K or higher, and more specifically 0.3 W/K or higher.

According to some embodiments, the base arrangement 120 has a total thermal conductance of 0.1 W/K or higher, specifically 0.2 W/K or higher, and more specifically 0.5 W/K or higher.

According to an embodiment, the first base element 122 and/or the second base element has a cylindrical shape.

According to an embodiment, the first base element 122 and/or the second base element 124 has a cylinder diameter of 2 mm or larger, specifically 2.5 mm or larger, more specifically 3 mm or larger.

According to an embodiment, the base arrangement include one or more further base elements.

According to an embodiment, the emitter tip 110 is not directly supported by the base arrangement, rather it is supported via the filament 130 only.

According to an embodiment, the first base element 122 and/or the second base element 124 is made from a material selected from the group consisting of tungsten, molybdenum, tantalum, rhodium, iridium, and any combination thereof.

Figure 3:
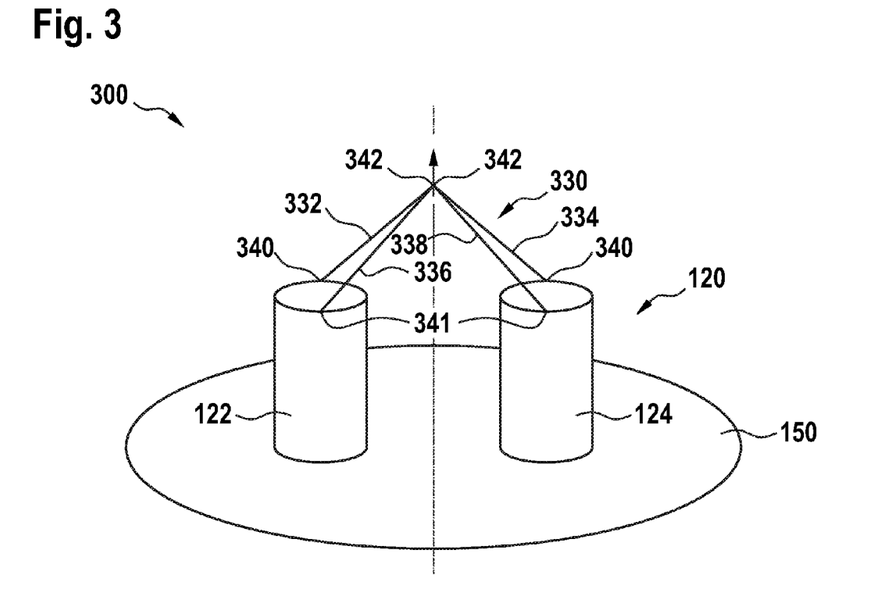
FIG. 3 shows a schematic view of a cold field emitter for an electron beam device according to yet further embodiments described herein.

FIG. 3 shows a schematic view of a cold field emitter 300 for an electron beam device according to yet further embodiments described herein.

The filament 330 of the cold field emitter 300 includes a first filament and a second filament. In other words, the filament 330 uses two parallel filaments. As an example, the first filament includes a first filament portion 332 and a third filament portion 336, and the second filament includes the second filament portion 334 and the fourth filament portion 338. The first filament and the second filament can be joined, e.g. welded together, in a central portion, for instance a portion or area in which the first filament and the second filament connect to the emitter tip 110. Each of the first filament and the second filament can be made from a single piece of material, such as a wire, as it is described with respect to FIG. 1.

According to some embodiments, which can be combined with other embodiments described herein, the filament 130 includes the first filament portion 332 and the second filament portion 334, and further includes one or more further filament portions, such as at least the third filament portion 336 and the fourth filament portion 338. The third filament portion 336 extends between the emitter tip 110 and the first base element 122 and the fourth filament portion 338 extends between the emitter tip 110 and the second base element 124.

The filament portions connected to a respective base element can be substantially identical and/or arranged in a substantially symmetrical way. A tendency to drifts caused by asymmetry can be minimized. The filaments or filament portions are bonded to a supporting structure (i.e., the base arrangement 120), which can be common or separate. As an example, the first filament portion 332 and the third filament portion 336 can be bonded to the first base element 122, for example, at the same or two separate attachment points. In particular, the first filament portion 332 can be bonded to the first base element 122 at a first attachment point 340 and the third filament portion 336 can be bonded to the first base element 122 at a second attachment point 341. Likewise, the second filament portion 334 and the fourth filament portion 338 can be bonded to the second base element 124, for example, at the same or two separate attachment points. In particular, the second filament portion 334 can be bonded to the second base element 124 at a first attachment point 340 and the fourth filament portion 338 can be bonded to the second base element 124 at a second attachment point 341.

According to some embodiments, the base arrangement includes two or more base elements. Specifically, one or more further base elements could be provided in addition to the first base element 122 and the second base element 124. An example, each filament portion could be bonded to a respective base element. Specifically, the first filament portion 332 could be bonded to the first base element 122 and the third filament portion 336 could be bonded to a third base element (not shown). Likewise, the second filament portion 334 could be bonded to the second base element 124 and the fourth filament portion 338 could be bonded to a fourth base element (not shown).

In some implementations, both filaments are bonded, e.g. welded, together in the upper position or central portion, i.e., at the emitter tip 110. As an example, the first filament portion 332, the second filament portion 334, the third filament portion 336, and the fourth filament portion 338 can be bonded or attached to the emitter tip 110 in/at an emitter attachment point 342. This structure assures mechanical stability and high resonance frequency.

Figure 4:
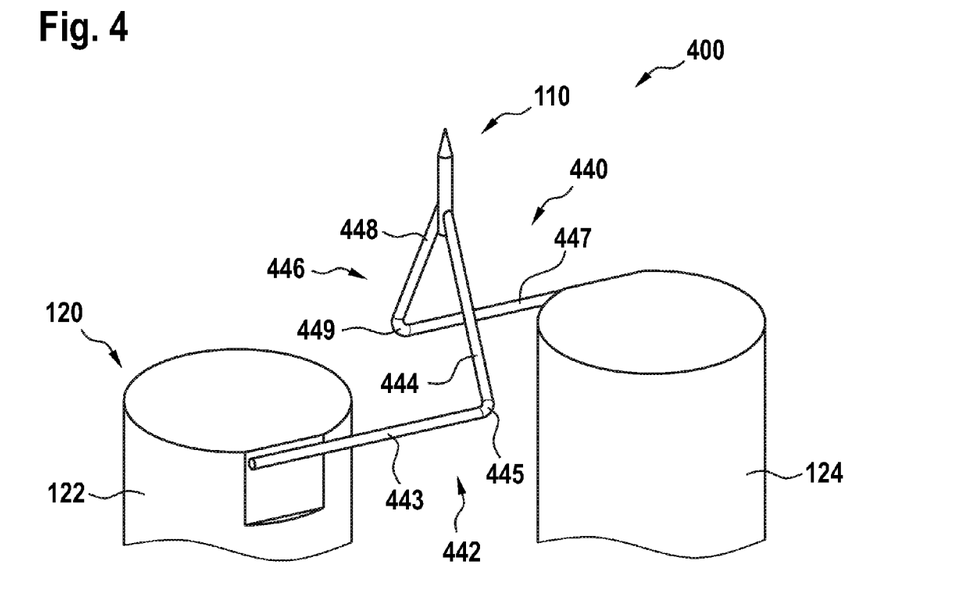
FIG. 4 shows a schematic view of a cold field emitter for an electron beam device according to embodiments described herein.

FIG. 4 shows a schematic view of a cold field emitter 400 for an electron beam device according to embodiments described herein.

According to an aspect of the present disclosure, which can be combined with other aspects described therein, the cold field emitter 400 has a filament 440 including a first filament portion 442 having a first bend 445 or first kink and a second filament portion 446 having a second bend 449 or second kink. The first bend 445 separates the first filament portion 442 in a first section 443 connected to the first base element 122 and a second section 444 connected to the emitter tip 110. The second bend 449 separates the second filament portion 446 in a third section 447 connected to the second base element 124 and a fourth section 448 connected to the emitter tip 110. In some implementations, the filament 440 can be made of one single piece of material, such as a wire. As an example, the filament 440 can have three bends providing the shape shown in FIG. 4, namely the first bend 445, the second bend 449 and a third bend in a region where the emitter tip 110 is attached to the filament 440. In alternative examples, the filament 440 can be made from two or more pieces bonded together, e.g., at the first bend 445, the second bend 449 and/or the third bend.

An angle between the first section 443 and the second section 444, the angle being provided by the first bend 445, can be in a range of 60° to 120°, and can specifically be about 90°. In particular, the first section 443 and the second section 444 can extend substantially perpendicular to each other. Likewise, an angle between the third section 447 and the fourth section 448, the angle being provided by the second bend 449, can be in a range of 60° to 120°, and can specifically be about 90°. In particular, the third section 447 and the fourth section 448 can extend substantially perpendicular to each other.

In some implementations, the second section 444 and the fourth section 448 form a V-shape, for example, in a first plane. Additionally or alternatively, the first section 443 and the third section 447 can extend substantially parallel to each other, for example, in a second plane. The first plane and the second plane can be substantially perpendicular to each other. As an example, the first plane can be a vertical plane and the second plane can be a horizontal plane.

The terms "substantially perpendicular" and "substantially parallel" relate to a substantially perpendicular or parallel orientation e.g. of the sections of the filament portions, wherein a deviation of a few degrees, e.g. up to 5° or even up to 10°, from an exact perpendicular or parallel orientation is still considered as "substantially perpendicular" or "substantially parallel", respectively.

The configuration, and particularly the connection arrangement, of the cold field emitter can be identical or similar to the configurations described with respect to FIGS. 1 to 3, and a description of similar or identical aspects is not repeated. In some implementations, a length of the first filament portion 442 and a length of the second filament portion 446 can even be 4 mm or larger. Likewise, a diameter of the first filament portion 442 and the second filament portion 446 can be 0.13 mm or larger. Yet, the cold field emitter 400 has an improved mechanical stability due to the bending of the filament portions.

Figure 5:
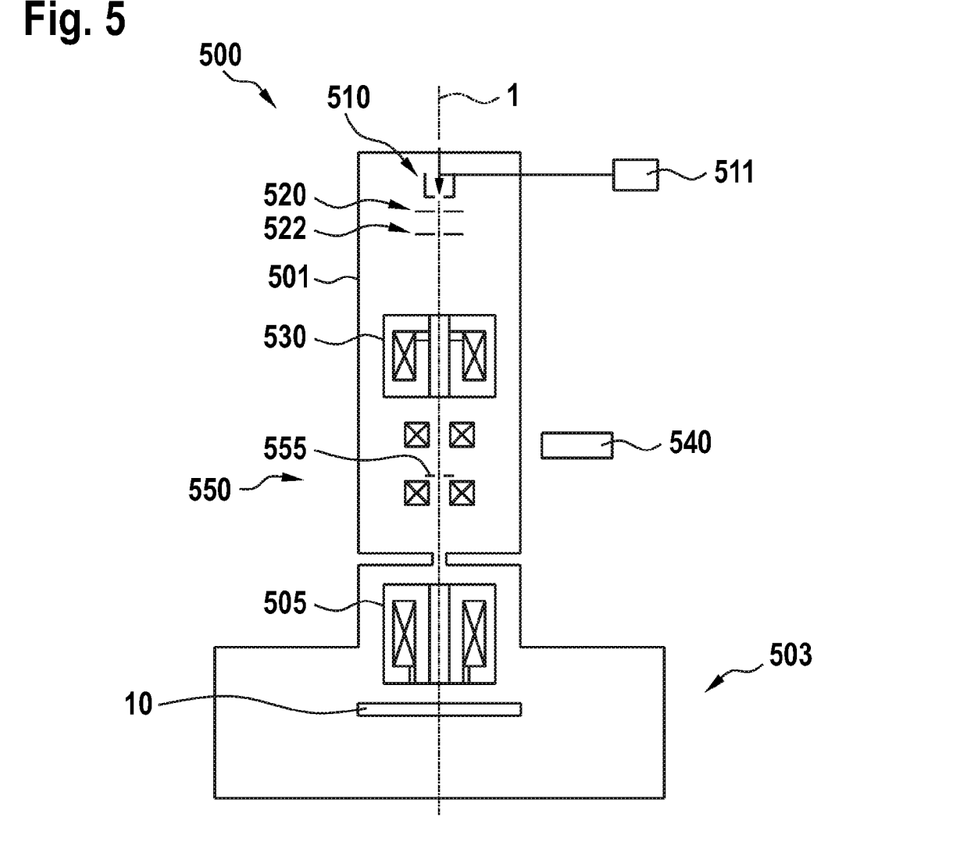
FIG. 5 shows a schematic view of an electron beam device according to embodiments described herein.

FIG. 5 shows a schematic view of an electron beam device 500 according to embodiments described herein. The electron beam device 500 can be an electron microscope, such as a scanning electron microscope (SEM).

The electron beam device 500 includes an electron beam source including a cold field emitter 510 for emitting an electron beam, e.g., along an optical axis 1, electron beam optics for directing and focusing the electron beam onto a sample 10, and a detector device 540 for detecting secondary charged particles generated by impingement of the electron beam on the sample 10. The cold field emitter 510 can be configured according to the embodiments described herein.

A "sample" as referred to herein, includes, but is not limited to, semiconductor wafers, semiconductor workpieces, and other workpieces such as memory disks and the like. Embodiments of the disclosure may be applied to any workpiece on which material is deposited or any workpiece which is structured. Upon irradiation of the sample 10 by the electron beam, signal charged particles, such as secondary electrons (SE), are created, which may carry information about the topography, chemical constituents and/or electrostatic potential of the sample and others. The secondary electrons can include at least one of backscattered electrons and Auger electrons. The signal charged particles can be collected and guided to the detector device 540, which can be a detector, sensor, e.g., a scintillator, a pin diode or the like.

According to some embodiments described herein, the electron beam device 500 can include a housing 501 and a sample chamber 503 connected to the housing 501. The cold field emitter 510 can be provided in the housing 501. In alternative embodiments, all elements may be arranged within one housing or chamber. The sample 10 can be provided in the sample chamber 503. The sample 10 can be provided on a sample support (not shown). The sample support can be a movable stage for positioning the sample 10. For example, the movable stage can be configured for moving the sample 10 in one direction (e.g. X direction), in two directions (e.g. X-Y-directions), or in three directions.

According to some embodiments described herein, the electron beam device 500 includes a regeneration device 511 configured for regeneration of the cold field emitter 510. The regeneration device 511 includes a heating device configured to heat at least the emitter tip of the cold field emitter 510 via the filament. In particular, the heating device can be configured for providing heat pulses to the emitter tip. For instance, the heating device may provide a heating current flowing through the filament, which can also be referred to as "heating filament".

The (primary) electron beam is guided in the electron beam device 500 along the optical axis 1 and is focused on the sample 10 using an objective lens 505. The objective lens 505 is exemplarily shown within the sample chamber 503. According to some embodiments, the objective lens 505 images, for example, the emitter tip of the cold field emitter 510 on the sample 10. In some implementations, the objective lens 505 can be provided by a magnetic lens portion and an electrostatic lens portion. According to some embodiments, which can be combined with other embodiments described herein, a deceleration of the (primary) electron beam can be provided, for example, in the vicinity of the sample 10, in or behind the objective lens 505, or a combination thereof. For example, according to some embodiments, a retarding bias voltage can be applied to the sample 10. The objective lens 505 can be an electrostatic-magnetic compound objective lens having e.g. an axial gap or a radial gap, or the objective lens 505 can be an electrostatic retarding field lens.

According to embodiments described herein, a condenser lens 530 can be provided. The condenser lens 530 can be magnetic and have pole pieces and one or more coils. Alternatively, the condenser lens 530 can be electrostatic or combined magnetic-electrostatic. According to some embodiments, the condenser lens may be an immersion condenser lens.

In some embodiments, at least one of an extractor device 520 and an anode 522 can be provided at the cold field emitter 510. The extractor device 520 can be configured for providing a voltage difference to the emitter tip of the cold field emitter 510. The anode 522 can be configured to accelerate the (primary) electron beam. As an example, the anode 522 can be configured to accelerate the electron beam so that the electron beam has a predetermined energy when the electron beam passes along the optical axis 1 of the electron beam device 500. In some implementations, the energy of the electron beam leaving the extractor device 520 and/or the anode 522 can be in a range of 5 keV or above, specifically in a range of 10 keV to 50 keV, and more specifically about 15 or 40 keV. According to some embodiments, in transmission electron microscopes (TEM) and scanning transmission microscopes (STEM) the beam energy can even exceed 100 keV.

In some embodiments, a beam deflection device 550 is provided for deflecting and guiding the electron beam. According to some embodiments, a signal charged particle beam is released or backscattered from the sample 10 when the primary electron beam hits or impinges on the sample 10. The signal (or secondary) charged particle beam may be separated from the primary charged particle beam by means of the beam deflection device 550 according to some embodiments described herein. The beam deflection device 550 can include at least one of a beam splitter and a beam bender, one or more apertures, such as a spray aperture or knife edge aperture 555, or any combination thereof. The signal charged particle beam may be guided towards a detector assembly or the detector device 540, which can include a sensor, such as a scintillator, pin diode and the like.

One or more other optical components like alignment systems, correction systems, further detection systems and the like that are not shown in the present figures can be provided in embodiments of the electron beam device. Elements described for the electron beam device like condenser lenses, apertures, deflectors and other optical components may be referred to as charged particle beam optics or electron beam optics for directing and focusing the electron beam device to the sample 10.

Figure 6:
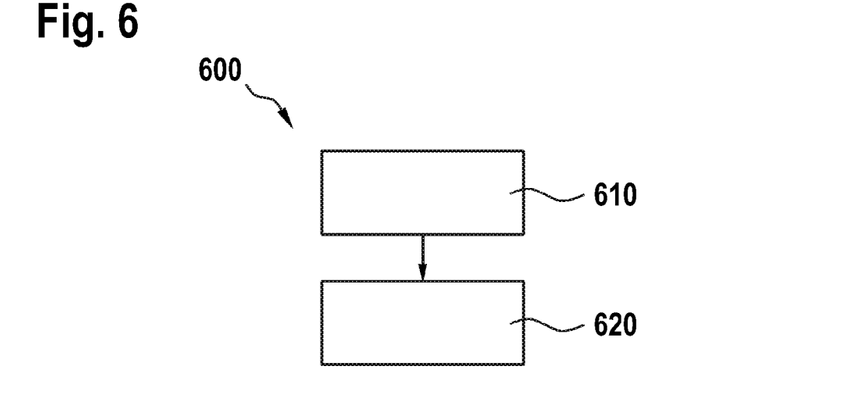
FIG. 6 shows a flowchart of a method for regeneration of a cold field emitter according to embodiments described herein.

FIG. 6 shows a flowchart of a method 600 for regeneration of a cold field emitter according to embodiments described herein. The method 600 can use the cold field emitter as described herein. Likewise, the cold field emitter described herein can be regenerated using the method 600.

Residual gases in the housing 501 can adsorb onto the emitter tip of the cold field emitter 510, causing changes in the emission characteristics. Moreover, electrons from the cold field emitter collide with the gas molecules, producing positive ions that can be accelerated back towards the cold field emitter by an electric field. The impact of these ions damage the emitter tip by dislocating material from a surface of the emitter tip. The damaged surface can change the electron emission characteristics. In Schottky emitters, which operate at above 1500 K, the surface of the emitter tip repairs itself, as atoms migrate over the surface. Such a self-repair does not occur in cold field emitters, which operate at close to room temperature. Cold field emitters can be heated periodically using the method 600 of the present disclosure to allow surface atoms to migrate to repair damage and to remove molecules that are adsorbed onto the surface of the emitter tip.

The method 600 includes, in block 610, heating an emitter tip of a cold field emitter according to the embodiments described herein. Specifically, the emitter tip can be heated or pulse heated via a first filament portion connecting the emitter tip to a first base element and a second filament portion connecting the emitter tip to a second base element. In some implementations, a length of each of the first filament portion and the second filament portion is 4 mm or less, and a diameter of a cross-section of each of the first filament portion and the second filament portion is 0.13 mm or less. In some embodiments, the method 600 includes, in block 620, an operating of the cold field emitter after the heating to emit an electron beam.

According to embodiments described herein, the method for regeneration of a cold field emitter can be conducted by means of computer programs, software, computer software products and the interrelated controllers, which can have a CPU, a memory, a user interface, and input and output means being in communication with the corresponding components of the apparatus for processing a large area substrate.

The present disclosure provides a cold field emitter having a filament with a first filament portion and a second filament portion having improved mechanical and thermal characteristics. In some embodiments, a length of each of a first filament portion and a second filament portion of the filament is 4 mm or less, and a diameter of a cross-section of each of the first filament portion and the second filament portion is 0.13 mm or less. The combination of the length and the diameter can provide an improved mechanical stability and an improved thermal performance, for example, during and/or after a heating procedure. As an example, a thermal and/or mechanical stabilization time after a heating procedure can be reduced to several seconds. A downtime of the electron beam device can be reduced and a throughput can be increased. Further, the mechanically stable configuration can improve a resolution of the electron beam device.

While the foregoing is directed to embodiments of the disclosure, other and further embodiments of the disclosure may be devised without departing from the basic scope thereof, and the scope thereof is determined by the claims that follow.

The invention claimed is:

1. An electron beam device for inspecting a sample with an electron beam, comprising:
   an electron beam source comprising a cold field emitter for emitting an electron beam, the cold field emitter comprising:
   an emitter tip;
   a base arrangement configured for supporting the emitter tip and comprising a first base element and a second base element; and
   a filament having at least a first filament portion, a second filament portion, a third filament portion, and a fourth filament portion attaching the emitter tip to the base arrangement, wherein the first filament portion and the third filament portion extend between the emitter tip and the first base element, and the second filament portion and the fourth filament portion extend between the emitter tip and the second base element, wherein a length of each of the first filament portion and the second filament portion is 4 mm or less, and wherein a diameter of a cross-section of each of the first filament portion and the second filament portion is 0.13 mm or less, electron beam optics for directing and focusing the electron beam onto the sample; and a detector device for detecting secondary charged particles generated by impingement of the electron beam on the sample.

2. The electron beam device of claim 1, wherein the emitter tip includes a material selected from the group consisting of tungsten, tantalum, rhenium, molybdenum, iridium, alloys thereof, and any combination thereof.

3. The electron beam device of claim 1, further including a regeneration device configured for regeneration of the cold field emitter, the regeneration device including a heating device configured to heat at least the emitter tip via the filament.

4. A cold field emitter for an electron beam device, comprising:

an emitter tip;

a base arrangement configured for supporting the emitter tip and comprising a first base element and a second base element; and a filament having at least a first filament portion and a second filament portion attaching the emitter tip to the base arrangement, wherein the first filament portion extends between the emitter tip and the first base element and the second filament portion extends between the emitter tip and the second base element, wherein a length of each of the first filament portion and the second filament portion is 4 mm or less, and wherein a diameter of a cross-section of each of the first filament portion and the second filament portion is 0.13 mm or less, and wherein the first filament portion has a first bend and the second filament portion has a second bend, the first bend separating the first filament portion into a first section that is connected to the first base element and a second section that is connected to the emitter tip, and the second bend separating the second filament portion into a third section that is connected to the second base element and a fourth section that is connected to the emitter tip, wherein the first section of the first filament portion and the third section of the second filament section extend substantially parallel to each other.

5. The cold field emitter of claim 4, wherein the length of each of the first filament portion and the second filament portion is 3 mm or less, or 2 mm or less.

6. The cold field emitter of claim 4, wherein a resonance frequency of the emitter tip and the filament is 5 kHz or higher.

7. The cold field emitter of claim 4, wherein a circumference of the cross-section of each of the first filament portion and the second filament portion is continuous.

8. The cold field emitter of claim 4, wherein the cross-section of each of the first filament portion and the second filament portion is round, oval or rectangular.

9. The cold field emitter of claim 4, wherein the first filament portion and the second filament portion form a V-shape.

10. The cold field emitter of claim 4, wherein the second section and the fourth section form a V-shape.

11. The cold field emitter of claim 4, wherein at least one of the first base element and the second base element has a thermal conductance of 0.05 W/K or higher, or 0.3 W/K or higher.

12. The cold field emitter of claim 4, wherein the first base element and the second base element are made from a material selected from the group consisting of tungsten, molybdenum, tantalum, rhodium, iridium, and any combination thereof.

13. The cold field emitter of claim 4, wherein the first base element and the second base element have a cylindrical shape.

14. The cold field emitter of claim 13, wherein the first base element and the second base element have a cylinder diameter of 2 mm or larger.

15. The cold field emitter of claim 4, further including a regeneration device configured for regeneration of the cold field emitter, the regeneration device including a 15 heating device configured to heat at least the emitter tip via the filament.

* * * * *